(12) United States Patent
Pu et al.

(10) Patent No.: US 11,824,436 B2
(45) Date of Patent: Nov. 21, 2023

(54) POWER SUPPLY GLITCH DETECTION

(71) Applicant: Apple Inc., Cupertino, CA (US)

(72) Inventors: Xiao Pu, Campbell, CA (US); Bruce A. Doyle, Longmont, CO (US)

(73) Assignee: Apple Inc., Cupertino, CA (US)

( * ) Notice: Subject to any disclaimer, the term of this patent is extended or adjusted under 35 U.S.C. 154(b) by 241 days.

(21) Appl. No.: 17/335,582

(22) Filed: Jun. 1, 2021

(65) Prior Publication Data

US 2022/0385170 A1    Dec. 1, 2022

(51) Int. Cl.
| | |
|---|---|
| *H02M 1/32* | (2007.01) |
| *H02H 9/04* | (2006.01) |
| *H02M 3/158* | (2006.01) |
| *G06F 1/3206* | (2019.01) |
| *G01R 31/317* | (2006.01) |
| *H02M 1/088* | (2006.01) |

(52) U.S. Cl.
CPC ........ *H02M 1/32* (2013.01); *G01R 31/31721* (2013.01); *G06F 1/3206* (2013.01); *H02H 9/041* (2013.01); *H02M 3/158* (2013.01); *H02M 1/088* (2013.01)

(58) Field of Classification Search
CPC ........ H02M 1/32; H02M 3/158; H02M 1/088; H02H 9/041; G01R 31/31721; G06F 1/3206

See application file for complete search history.

(56) References Cited

U.S. PATENT DOCUMENTS

| | | | |
|---|---|---|---|
| 8,908,341 B2* | 12/2014 | Prabhu | H02H 9/046 361/111 |
| 8,982,522 B2 | 3/2015 | Duan et al. | |
| 9,287,772 B2 | 3/2016 | Hussien et al. | |
| 9,563,211 B2 | 2/2017 | Li | |
| 10,331,410 B2* | 6/2019 | Wesson | G06F 7/582 |
| 10,466,275 B1* | 11/2019 | Vundavalli | G01R 22/066 |
| 11,187,731 B2* | 11/2021 | Xue | G01R 19/16538 |
| 11,486,912 B2* | 11/2022 | Heo | G06F 21/556 |
| 11,609,277 B2* | 3/2023 | Xue | G06F 1/305 |
| 2018/0164351 A1* | 6/2018 | Nirwan | H03K 5/1534 |

* cited by examiner

*Primary Examiner* — Rafael O De Leon Domenech

(74) *Attorney, Agent, or Firm* — Kowert, Hood, Munyon, Rankin & Goetzel, P.C.; Dean M. Munyon

(57) ABSTRACT

A detector circuit included in a computer system filters the voltage level of a power supply node to generate filtered signals. The detector circuit either compares the filtered signals or samples the filtered signal and compares the samples to reference levels to detect changes in the voltage level of the power supply node that exceed thresholds for magnitude and duration. A control circuit included in the computer system generates, using the glitch signal, control signals that can be used to change operating parameters of functional circuits included in the computer system.

20 Claims, 13 Drawing Sheets

POWER SUPPLY GLITCH DETECTION

BACKGROUND

Technical Field

Embodiments described herein relate to integrated circuits, and, more particularly, to techniques for detecting power supply glitches.

Description of the Related Art

Modern computer systems may include multiple circuit blocks designed to perform various functions. For example, such circuit blocks may include processors and/or processor cores configured to execute software or program instructions. Additionally, the circuit blocks may include memory circuits, mixed-signal or analog circuits, and the like.

In some computer systems, the circuit blocks may be designed to operate at different power supply voltage levels. Power management circuits may be included in such computer systems to generate and monitor varying power supply voltage levels on the power supply nodes for the different circuit blocks. Power management circuits often include one or more power supply circuits configured to generate regulated voltage levels on respective power supply signals using a voltage level of an input power supply signal.

Circuit blocks drawing power from such power supply signals can cause instantaneous demands for current that exceed the capabilities of power supply circuits to generate, resulting in noise and glitches in the power supply signals. Parasitic circuit elements coupled to nodes for the power supply signals can further contribute to the noise and glitches.

SUMMARY OF THE EMBODIMENTS

Various embodiments for detecting glitches on a power supply node are disclosed. Broadly speaking, a detector circuit is configured to filter a voltage level of a power supply node to generate a plurality of filtered signals. The detector circuit is further configured to generate, using at least one of the plurality of filtered signals, an indication signal in response to a detection of a change in the voltage level of the power supply node. A magnitude of the change in the voltage level of the power supply node may exceed a first threshold value and a duration of the change in the voltage level of the power supply node exceeds a second threshold value. A control circuit is configured to generate one or more control signals using the indication signal.

BRIEF DESCRIPTION OF THE DRAWINGS

The following detailed description makes reference to the accompanying drawings, which are now briefly described.

DETAILED DESCRIPTION OF EMBODIMENTS

Figure 1:
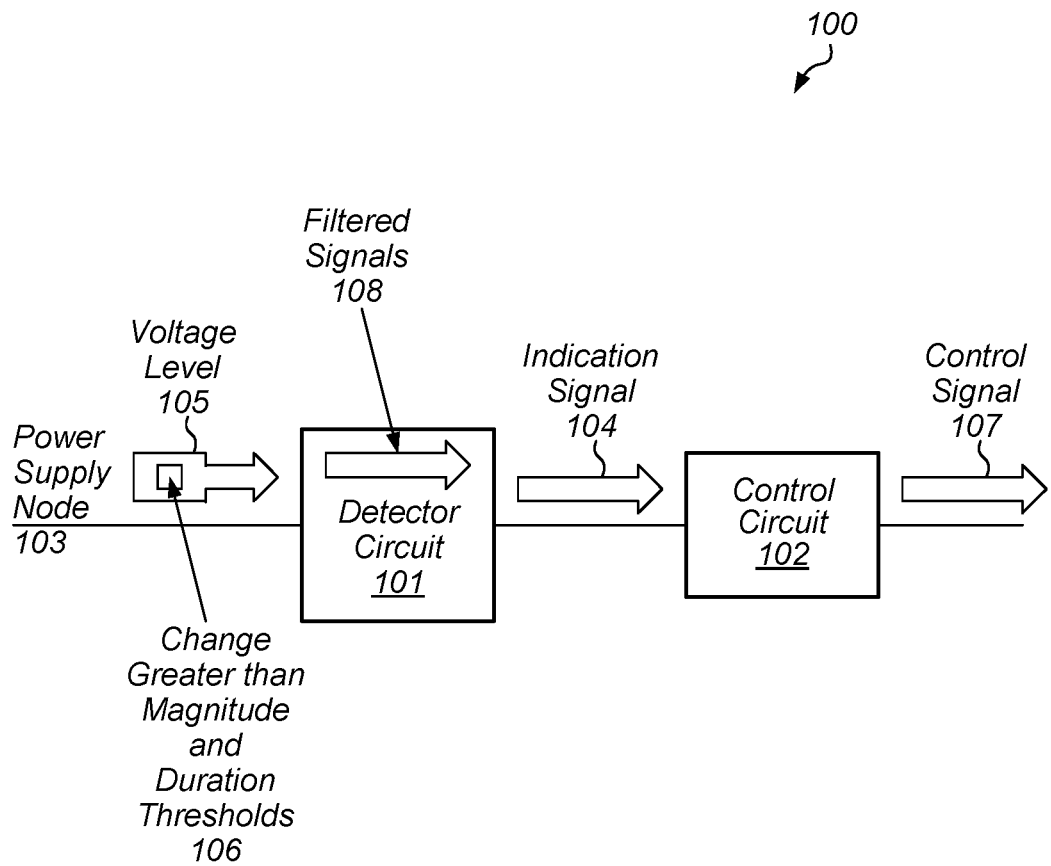
FIG. 1 is a block diagram of an embodiment of a power supply monitor circuit.

Computer systems may include multiple circuit blocks configured to perform specific functions. For example, a computer system may include a processor circuit, a memory circuit, and various analog, radio-frequency, and mixed-signal circuits. Such circuit blocks may operate using different power supply voltage levels.

Power management circuits (also referred to as "power management units" or "PMUs") may be included in computer systems to generate and monitor the various power supply voltage levels for the different circuit blocks. Such power management circuits often include one or more power supply circuits (e.g., linear regulators, buck converters, and the like) configured to generate regulated voltage levels on respective power supply signals using a voltage level of an input power supply signal.

Power supply signals can be contaminated with noise and glitches. Such contamination may be the result of reactive impedance of a power supply grid, noise from load circuits coupling back onto a power supply node (referred to as "kick back"), coupling of neighboring signals into power supply nodes, and the like. Such glitches can be localized to particular points on the power supply grid. In some cases, individual pulses within a glitch can be of sufficient duration (e.g., 2 nanoseconds) and magnitude (e.g., 50 millivolts peak-to-peak) that a glitch may take multiple clock cycles before it damps out.

Glitches on power supply nodes can be detrimental to circuit operation within a computer system. The glitches can affect the timing of critical paths, leading to setup and/or hold time issues with latch and flip-flop circuits. Additionally, the glitches can affect storage circuits leading to changes in the logic state of stored bits. Analog and mixed-signal circuit performance can also be affected by power supply glitches. The effect that glitches may have on circuit operation may be used to circumvent security of a computer system. In some cases, a user may introduce glitches on a power supply to induce a fault into the computer system, which can allow the user to execute malicious software programs or applications on the computer system.

Since power supply glitches can result in undesirable performance within a computer system, some computer systems employ sensor circuits to detect power supply glitches. Knowledge regarding the timing, location, magnitude, and duration of power supply glitches can be used to regulate performance of functional circuits within the computer system, modify program applications or software executed by the computer system, or influence circuit design and implementation of future versions of circuits included in the computer system.

Current solutions for detecting power supply glitches include routing different power supply signals to a central comparator where they are compared to a reference voltage level. Switches are used to couple the different power supply signals to the wiring leading to the comparator. The switches and parasitic circuit elements associated with the routing can desensitize power supply glitches making them difficult to detect. Moreover, the central comparator needs to have a high bandwidth with low offset, which can result in high power consumption.

Techniques described in the present disclosure allow for the detection of glitches on a power supply signal using a combination of filtering and sampling of the power supply signal. By employing such techniques, a power supply glitch circuit can be made more sensitive to glitches in a power supply signal, as well as eliminating the use of high-speed power-hungry comparator circuits.

Turning to FIG. 1, a block diagram of an embodiment of a power supply monitoring circuit is depicted. As illustrated, power supply monitor circuit 100 includes detector circuit 101 and control circuit 102.

Detector circuit 101 is configured to filter voltage level 105 of power supply node 103 to generate filtered signals 108. As described below, detector circuit 101 may employ a combination of high-pass filter circuits and low-pass filter circuits to generate filtered signals 108.

Detector circuit 101 is further configured to generate indication signal 104 using filtered signals 108 in response to a detection of a change in voltage level 105. In various embodiments, a magnitude of the change in voltage level 105 may exceed a first threshold value of thresholds 106, and a duration of the change in voltage level 105 may exceed a second threshold value of thresholds 106. As described below, detector circuit 101 may use filtered signals 108 in a variety of ways to detect the change in voltage level 105. For example, in some embodiments, detector circuit 101 may compare different ones of filtered signals 108, while in other embodiments, detector circuit 101 may sample one of filtered signals 108 and compare the sample to a reference voltage.

Control circuit 102 is configured to generate control signals 107 using indication signal 104. As described below, control signals 107 may be used to modify operating parameters of functional circuit blocks coupled to power supply node 103. By adjusting such operating parameters, the operation of the functional circuit blocks may be modified to reduce changes in voltage level 105 induced by their operation.

Additionally, control circuit 102 may be further configured to record data indicative of when indication signal 104 was activated, such as timestamp information. Such data may be used to identify certain circumstances (e.g., activation of particular functional circuits, execution of particular program applications or software, etc.) that generate glitches in voltage level 105 on power supply node 103. In some cases, the recorded data may be used as part of a debug or characterization operations performed on a computer system. For example, during a debug information, certain circuit may be selectively powered on and off, and the effect on glitches on power supply node 103 characterized by using information recorded by control circuit 102. Such characterization can be used to understand how particular circuits are generating glitches on power supply node 103.

Figure 2:
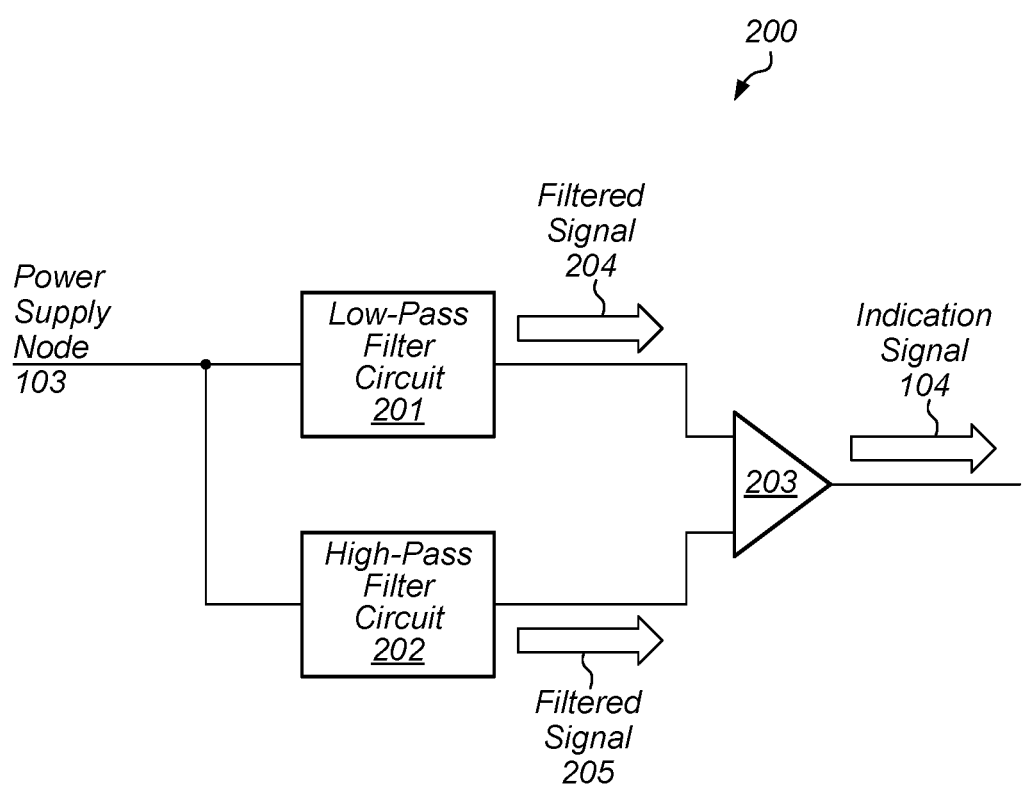
FIG. 2 is a block diagram of an embodiment of a glitch detector circuit.

A block diagram of a detector circuit is depicted in FIG. 2. In various embodiments, detector circuit 200 may correspond to detector circuit 101 as depicted in FIG. 1. As illustrated, detector circuit 200 includes low-pass filter circuit 201, high-pass filter circuit 202, and comparator circuit 203.

Low-pass filter circuit 201 is configured to generate filtered signal 204 using a voltage level of power supply node 103. As described below in more detail, low-pass filter circuit 201 may be configured to attenuate frequency components included in the voltage level of power supply node 103 that are greater than a cutoff frequency to generate filtered signal 204.

High-pass filter circuit 202 is configured to generate filtered signal 205 using the voltage level of power supply node 103. As described below, high-pass filter circuit 202 may be configured to attenuate frequency components included in the voltage level of power supply node 103 less than a cutoff frequency. It is noted that the cutoff frequency employed by high-pass filter circuit 202 may be different than the cutoff frequency employed by low-pass filter circuit 201.

Filtered signal 204 includes low-frequency components of the voltage level of power supply node 103, while filtered signal 205 includes high-frequency components of the voltage level of power supply node 103. The high-frequency components correspond to noise and glitches, while the low-frequency components correspond to the DC level of the voltage of power supply node 103, or a scaled version of the DC level of the voltage of power supply node 103. By comparing filtered signal 204 and filtered signal 205, noise and glitches above a particular magnitude and duration may be detected.

Comparator circuit 203 is configured to generate indication signal 104 using filtered signal 204 and filtered signal 205. In various embodiments, comparator circuit 203 may be configured to amplify a difference between filtered signal 204 and filtered signal 205, and generate indication signal 104 based on the amplified difference between the two signals. Comparator circuit 203 may, in some embodiments, generate indication signal 104 as a digital signal, while in other embodiment, comparator circuit 203 may generate indication signal 104 as an analog signal. In various embodiments, comparator circuit 203 may be implemented as a differential amplifier circuit, Schmitt trigger circuit, or any other suitable comparator circuit.

Figure 3:
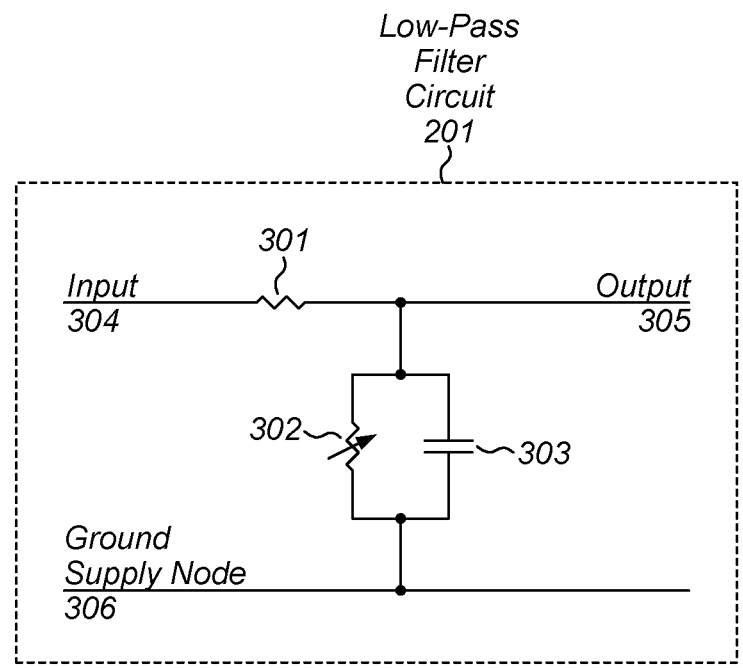
FIG. 3 is a block diagram of an embodiment of a low-pass filter circuit.

Turning to FIG. 3, a block diagram of an embodiment of low-pass filter circuit 201 is depicted. As illustrated, low-pass filter circuit 201 includes resistor 301, variable resistor 302, and capacitor 303.

Resistor 301 is coupled between input 304 and output 305. Variable resistor 302 is coupled between output 305 and ground supply node 306. Capacitor 303 is coupled, in parallel with variable resistor 302, between output 305 and ground supply node 306.

The combination of variable resistor 302 and capacitor 303 form a reactance that blocks low-frequency components of a signal injected on input 304 from coupling to ground supply node 306, instead forcing them onto output 305. At higher frequencies, the reactance drops, providing a path for high-frequency components to couple into ground supply node 306, preventing them from reaching a load coupled to output 305.

The values of resistor 301, variable resistor 302, and capacitor 303 determine a cutoff frequency for low-pass filter circuit 201. Frequency components of the signal injected on input 304 below the cutoff frequency are passed to the load, while frequency components of the signal injected on input 304 above the cutoff frequency are attenuated. The values of resistors 301, variable resistor 302, and capacitor 303 may, in various embodiments, be selected based on the magnitude and duration of glitches to be detected. The DC level of signals on output 305 are set by the values of resistor 301 and variable resistor 302 as shown in Equation 1, where $R_{301}$ is the value of resistor 301 and $R_{302}$ is the value of variable resistor 302.

$$V_{DC} = \frac{R_{302}}{R_{301} + R_{302}} \qquad (1)$$

In various embodiments, resistor 301 may be implemented using polysilicon, metal, or any other suitable material available in a semiconductor manufacturing process. Variable resistor 302 may be implemented as multiple polysilicon and/or metal resistors that are coupled together via switches. Different positions for the switches couple different ones of the multiple resistors between output 305 and ground supply node 306, thereby changing the value of variable resistor 302. In some embodiments, variable resistor 302 may be implemented as an active device, whose bias point determines the value for variable resistor 302. Capacitor 303 may, in some embodiments, be implemented as a metal-oxide-metal (MOM) structure, a metal-insulator-metal (MIM) structure, or any other suitable capacitor structure available in the semiconductor manufacturing process.

It is noted that although low-pass filter circuit 201 is implemented as an RC filter circuit, in other embodiments, low-pass filter circuit 201 may be implemented using any suitable filter circuit topology. For example, in some embodiments, low-pass filter circuit may be implemented as a RLC filter circuit or as an active low-pass filter circuit that includes an amplifier circuit.

Figure 4:
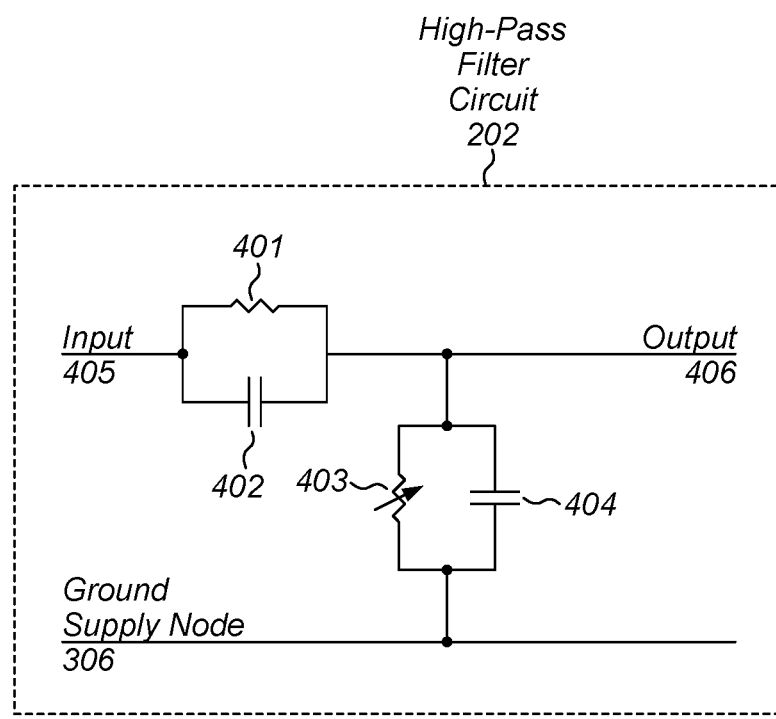
FIG. 4 is a block diagram of an embodiment of a high-pass filter circuit.

Turning to FIG. 4, a block diagram of an embodiment of high-pass filter circuit 202 is depicted. As illustrated, high-pass filter circuit 202 includes resistor 401, capacitor 402, variable resistor 403, and capacitor 404.

Resistor 401 is coupled between input 405 and output 406. Capacitor 402 is coupled, in parallel with resistor 401, between input 405 and output 406. Variable resistor 403 is coupled between output 406 and ground supply node 306, and capacitor 404 is coupled, in parallel with variable resistors 403, between output 406 and ground supply node 306.

The parallel combination of resistor 401 and capacitor 402 provides an impedance between input 405 and output 406. The impedance varies with frequency such that low frequency components included in a signal injected on input 405 are attenuated by the reactance of capacitor 402. The parallel combination of variable resistor 403 and capacitor 404 provides an impedance between output 406 and ground supply node 306. The ratio of high-frequency gain to low-frequency gain (referred to as "peaking gain") of high-pass filter circuit 202 is given in Equation 2, where $R_{401}$ is the value of resistor 401, $R_{403}$ is the value of variable resistor 403, $C_{402}$ is the value of capacitor 402, and $C_{404}$ is the value of capacitor 404.

$$\text{Gain} = \frac{R_{401} + R_{403}}{R_{403}} \cdot \frac{C_{402}}{C_{402} + C_{404}} \qquad (2)$$

As with low-pass filter circuit 201 as depicted in FIG. 3, the DC level of signals on output 406 are set by a scaling factor (SF) based on the values of resistor 401 and variable resistor 403 as shown in Equation 3, where $R_{401}$ is the value of resistor 401 and $R_{403}$ is the value of variable resistor 403.

$$SF = \frac{R_{403}}{R_{401} + R_{403}} \qquad (3)$$

In various embodiments, resistor 401 may be implemented using polysilicon, metal, or any other suitable material available in a semiconductor manufacturing process. Variable resistor 403 may be implemented as multiple polysilicon and/or metal resistors that are coupled together via switches. Different positions for the switches couple different ones of the multiple resistors between output 406 and ground supply node 306, thereby changing the value of variable resistor 403. In some embodiments, variable resistor 403 may be implemented as an active device whose bias point determines the value for variable resistor 403. Capacitors 402 and 404 may, in some embodiments, be implemented as a MOM structure, a MIM structure, or any other suitable capacitor structure available in the semiconductor manufacturing process.

It is noted that although high-pass filter circuit 202 is implemented as an RC filter circuit, in other embodiments, high-pass filter circuit 202 may be implemented using any suitable filter circuit topology. For example, in some embodiments, low-pass filter circuit may be implemented as a RLC filter circuit or as an active high-pass filter circuit that includes an amplifier circuit. It is further noted that high-pass filter circuit 202 may be used to perform both high-pass and low-pass filtering. In such cases, a switch may be place in series with capacitor 402. When the switch is closed, high-pass filter circuit 202 performs a high-pass filter operation, and when the switch is open, high-pass filter circuit 202 can perform a low-pass filter operation as well.

Figure 5:
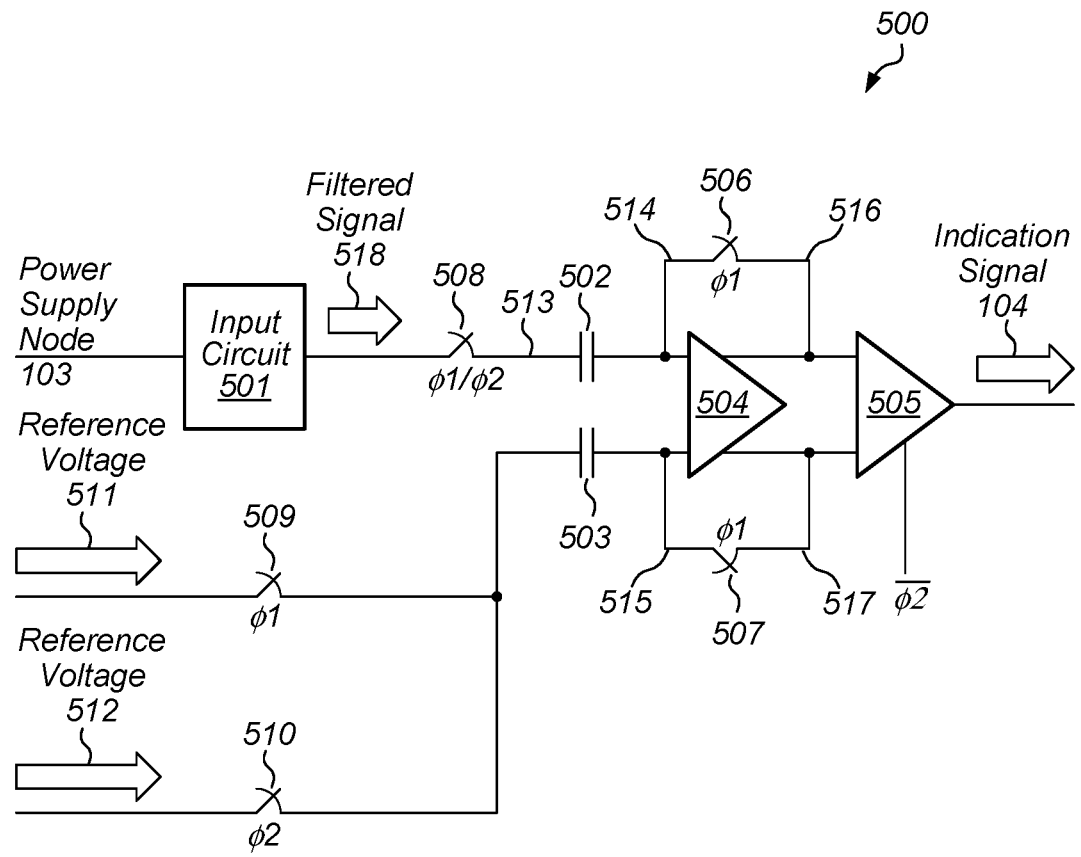
FIG. 5 is a block diagram of another embodiment of a glitch detector circuit.

In some cases, routing mismatches leading to the inputs of a comparator circuit can limit the sensitivity of detector circuit 200. One possible technique to remediate the limit on sensitivity is correlated double sampling. A block diagram of an embodiment of a detector circuit that employs correlated double sampling is depicted in FIG. 5. As illustrated, detector circuit 500 includes input circuit 501, capacitors 502 and 503, pre-amplifier circuit 504, latch circuit 505, and switches 506-510.

Input circuit 501 is coupled to power supply node 103 and is configured to generate filtered signal 518 using a voltage level of power supply node 103. As described below, input circuit 501 may employ a high-pass filter circuit and a buffer circuit to generate filtered signal 518. In various embodiments, filtered signal 518 may include high-frequency components of the voltage level of power supply node 103.

The output of input circuit 501 is coupled to capacitor 502 via switch 508, which is controlled by clock signals φ1 and φ2. Capacitor 502 is further coupled to node 513. Capacitor 503 is coupled to node 515, which is further coupled to switches 509 and 510. Switch 509 is controlled by clock signal φ1 and switch 510 is controlled by clock signal φ2.

When switch 508 is closed, the voltage level of filtered signal 518 is sampled by capacitor 502. When switch 509 is closed, reference voltage 511 is sampled by capacitor 503, and when switch 510 is closed, reference voltage 512 is sampled by capacitor 503. At the end of each complete cycle of φ1 and φ2, the voltage on node 514 may be a difference between two samples of filtered signal 518 taken during active times of φ1 and φ2, respectively. Moreover, at the end of each complete cycle of φ1 and φ2, the voltage on node 515 is the difference between reference voltage 511 and reference voltage 512. In various embodiments, reference voltage 511 and reference voltage 512 may be selected such that their difference corresponds to a maximum peak voltage that may be detected on the voltage level of power supply node 103. In some embodiments, the values of reference voltage 511 and reference voltage 512 may be generated using resistors included in input circuit 501.

A first input of pre-amplifier circuit 504 is coupled to node 514, and a second input of pre-amplifier circuit 504 is coupled to node 515. A first output of pre-amplifier circuit 504 is coupled to node 516, and a second output of pre-amplifier circuit is coupled to node 517. Switch 506 is coupled between nodes 514 and 516, and switch 507 is coupled between nodes 515 and 517.

Pre-amplifier circuit 504 is configured to generate respective voltage levels on nodes 516 and 517 based on the respective voltage levels of node 514 and 515. In various embodiments, a difference between the respective voltages of nodes 516 and 517 may be proportional to a difference between the respective voltage levels of nodes 514 and 515. When switches 506 and 507 are closed, the outputs of pre-amplifier circuit 504 are coupled to corresponding inputs of pre-amplifier circuit 504. By coupling the outputs to the inputs in this fashion, an offset cancellation operation (referred to as an "autozero operation") is performed on pre-amplifier circuit 504, which removes offset in pre-amplifier circuit 504. Pre-amplifier circuit 504 may, in some embodiments, be implemented as a differential amplifier circuit, or any other suitable amplifier circuit capable of generating a differentially encoded output.

Latch circuit 505 is configured to generate indication signal 104 using the voltage levels of nodes 516 and 517, and clock signal $\overline{\varphi 2}$. In various embodiments, latch circuit 505 may be configured to perform a comparison of the voltage levels of nodes 516 and 517. Using a result of the comparison, latch circuit 505 may determine a value for indication signal 104. For example, the voltage level of node 516 is greater than the voltage level of node 517, indication signal 104 may be set to a particular value, and if the voltage level of node 517 is greater than the voltage level of node 516, indication signal 104 may be set to a different value. In various embodiments, latch circuit 505 may be further configured to latch or store the value of indication signal 104 when φ1 is active. Latch circuit 505 may, in various embodiments, be implemented using a regenerative latch coupled to a secondary latch circuit. The regenerative latch circuit may be implemented using an amplifier circuit with positive feedback, a Schmitt trigger circuit, or any other suitable circuit, and the secondary latch circuit may be implemented using a pair of cross-coupled logic gates (e.g., cross-coupled NAND gates, NOR gates, inverters, etc.) or any other suitable circuit configured to store the output of the regenerative latch circuit.

Capacitors 502 and 503 may, in various embodiments, be implemented using a MOM structure, a MIM structure, or any other suitable capacitor structure available on a semiconductor manufacturing process. Switches 506-510 may be implemented as fully complementary pass-gates, single switch devices, or any other suitable circuit or structure configured to selectively couple its input/output terminals together based on a control signal.

It is noted that the clock signals controlling switches 509 and 510 may, in some embodiments, be switched to detect negative excursions on the voltage level of power supply node 103. Alternatively, a power monitoring system may employ two instances of detector circuit 500, each using different signals to control switches 509 and 510.

Figure 6:
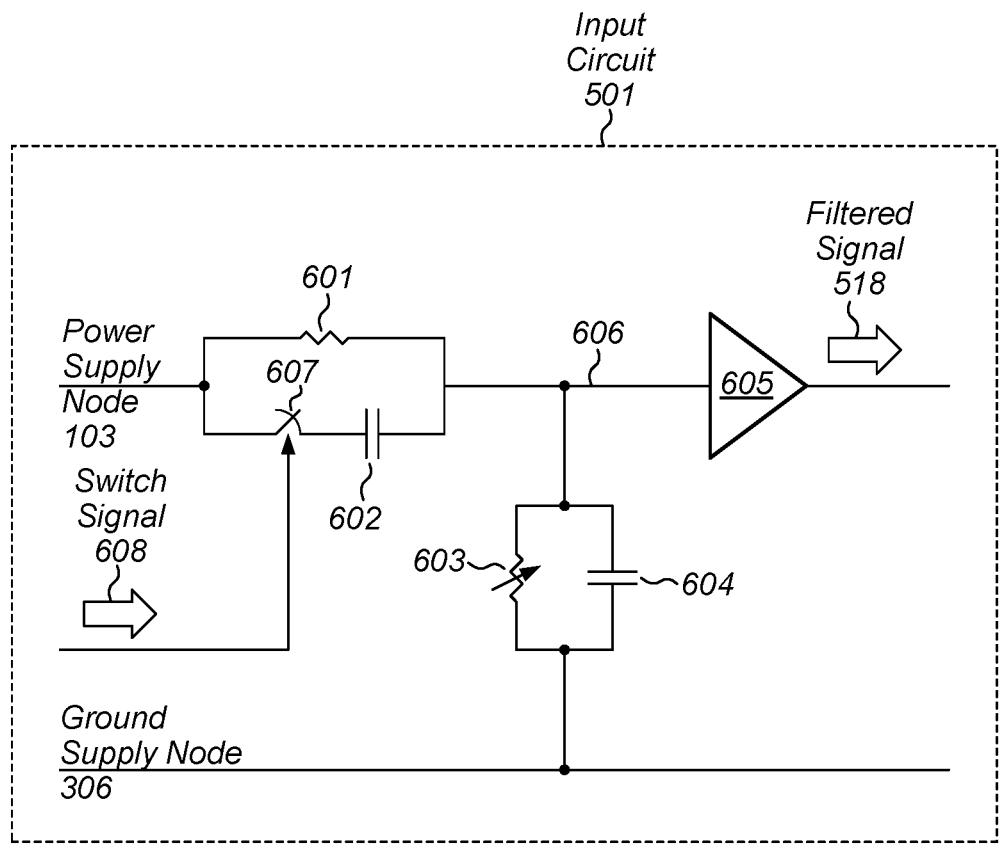
FIG. 6 is a block diagram of an embodiment of an input circuit used in a glitch detector circuit.

Turning to FIG. 6, a block diagram of an embodiment of input circuit 501 is depicted. In various embodiments, input circuit 501 may be configured to function as a combination of low-pass filter circuit 201 and high-pass filter circuit 202. As illustrated, input circuit 501 includes resistor 601, capacitor 602, variable resistor 603, capacitor 604, buffer circuit 605, and switch 607.

Resistor 601 is coupled between power supply node 103 and node 606. Switch 607 is coupled between power supply node 103 and capacitor 602, which is, in turn coupled, to node 606. Variable resistor 603 is coupled between node 606 and ground supply node 306, and capacitor 604 is coupled, in parallel with variable resistor 603, between node 606 and ground supply node 306. In various embodiments, when switch 607 is open, capacitor 602 is decoupled from power supply node 103, and the combination of resistor 601, variable resistor 603 and capacitor 604 function as a low-pass filter circuit. As described below, when switch 607 is closed, resistor 601, capacitor 602, variable resistor 603, and capacitor 604 form a high-pass filter circuit. Switch 607 is controlled by switch signal 608, which may, in some embodiments, correspond to an inverse of clock signal 701 denoted as inverse clock signal 702 in FIG. 7.

When switch 607 is closed, the parallel combination of resistor 601 and capacitor 602 provides an impedance between power supply node 103 and node 606. The impedance varies with frequency such that low frequency components included on power supply node 103 are attenuated based on a ratio of resistor 603 to a sum of resistors 601 and 603. The parallel combination of variable resistor 603 and capacitor 604 provides an impedance between node 606 and ground supply node 306. The peaking gain of input circuit 501 circuit is given in Equation 4, where $R_{601}$ is the value of resistor 601, $R_{603}$ is the value of variable resistor 603, $C_{602}$ is the value of capacitor 602, and $C_{604}$ is the value of capacitor 604.

$$\text{Gain} = \frac{R_{601} + R_{603}}{R_{603}} \cdot \frac{C_{602}}{C_{602} + C_{604}} \quad (4)$$

The DC level of signals on node 606 are set by a scaling factor (SF) whose value is based on the values of resistor 601 and variable resistor 603 as shown in Equation 5, where $R_{601}$ is the value of resistor 601 and $R_{603}$ is the value of variable resistor 603. It is noted that a product of SF and a nominal voltage level of power supply node 103 may be used as reference voltage 511.

$$SF = \frac{R_{603}}{R_{601} + R_{603}} \quad (5)$$

In various embodiments, resistor 601 may be implemented using polysilicon, metal, or any other suitable material available in a semiconductor manufacturing process. Variable resistor 603 may be implemented as multiple polysilicon and/or metal resistors that are coupled together via switches. Different positions for the switches couple different ones of the multiple resistors between node 606 and ground supply node 306, thereby changing the value of variable resistor 603. In some embodiments, variable resistor 603 may be implemented as an active device whose bias point determines the value for variable resistor 603. Capacitors 602 and 604 may, in some embodiments, be implemented as a MOM structure, a MIM structure, or any other suitable capacitor structure available in the semiconductor manufacturing process.

Buffer circuit 605 is configured to buffer a signal on node 606 to generate filtered signal 518. In some cases, buffer circuit 605 may increase a magnitude of the signal on node 606 to generate filtered signal 518, while in other cases, buffer circuit 605 may maintain the magnitude of the signal on node 606. In various embodiments, buffer circuit 605 may be implemented as a unity-gain amplifier circuit or any other suitable amplifier circuit.

Figure 7:
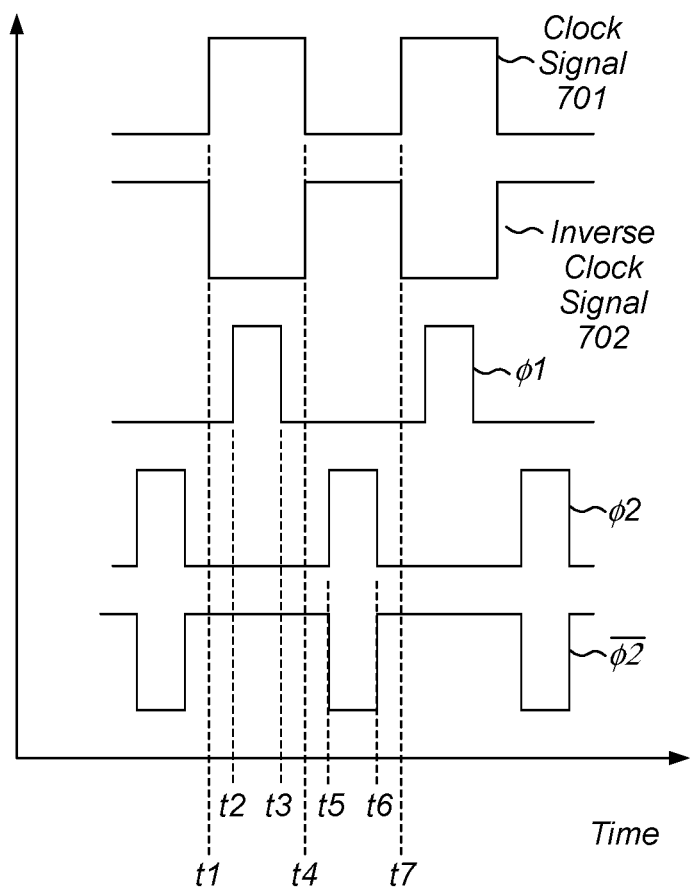
FIG. 7 is a diagram depicting clock signal waveforms associated with operating a glitch detector circuit.

Turning to FIG. 7, a diagram depicting clock signal waveforms associated with operating a glitch detector circuit is illustrated. It is noted that the depicted waveforms are merely examples and that, in other embodiments, the waveforms for clock signals 701, φ1, φ2, and $\overline{φ2}$ may have different relative timings.

At time t1, clock signal 701 transitions from a low-logic level to a high-logic level. As used and described herein, a low-logic level corresponds to a voltage level sufficient to activate a p-channel MOSFET, and a high-logic level corresponds to a voltage level sufficient to activate an n-channel MOSFET. It is noted that in other embodiments, where technologies other than CMOS are employed, different voltage levels may be used for the low-logic and high-logic levels.

In response to the transition of clock signal 701, at time t2, φ1 transitions from a low-logic level to a high-logic level, which remains at the high-logic level until time t3. As described above, while φ1 is at the high-logic level, filtered signal 518 is coupled to node 513. Since inverse clock signal 702 is at a low-logic level while φ1 is at a high logic level, filtered signal 518 is a low-pass version of power supply node 103. When φ1 transitions to a low-logic level at time t3, filtered signal 518 is sampled for a first time. As described below, filtered signal 518 is sampled a second time at time t6 in a process referred to as correlated double sampling ("CDS"). It is noted that the duration between time t2 and t3 can be of any suitable value, provided that t3 occurs prior to clock signal 701 transitioning back to the low-logic level at time t4.

In response to the transition of clock signal 701 at time t4, φ2 transitions from the low-logic level to the high-logic level. φ2 remains at the high logic level until time t6, at which point it transitions back to the low-logic level. As described above, while φ2 is at the high-logic level, reference voltage 512 is coupled to capacitor 503, and filtered signal 518 is coupled to node 513. As described above, when inverse clock signal 702 is at a high-logic level, filtered signal 518 is a high-pass filtered version of power supply node 103. At time t6, φ2 transitions to a low-logic level, and reference voltage 512 is sampled onto capacitor 503, and the high-pass version of filtered signal 518 is sampled onto capacitor 502. By sampling the two different versions of filtered signal 518 onto capacitor 502, a difference between the two different versions of filtered signal 518 is generated, which is, in turn, used to generate indication signal 104.

Also, at time t6, the regenerative latch portion of latch circuit 505 begins to resolve a difference between the voltage levels of nodes 516 and 517 to generate an updated value for indication signal 104. At the next rising edge of φ1, the state of indication signal is latched by the secondary latch in latch circuit 505. It is noted that the duration between time t5 and t6 can be of any suitable value, provided that t6 occurs prior to clock signal 701 transitioning back to the high-logic level at time t7.

Figure 8:
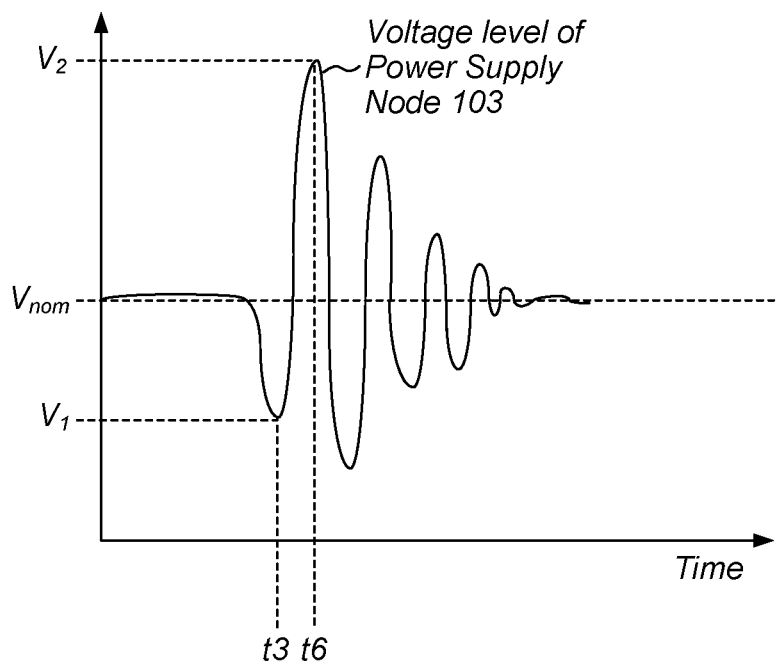
FIG. 8 is a diagram depicting waveforms associated with operating a glitch detector circuit.

Turning to FIG. 8, waveforms associated with operating detector circuit 500 are depicted. As illustrated, the voltage level of power supply node 103 experiences a power supply glitch that starts just prior to time t3. As described above, the power supply glitch includes multiple pulses that damp out over a period of time, allowing the voltage level of power supply node 103 to return to its nominal value (denoted "$V_{nom}$").

To illustrate the effect of clock signals φ1 and φ2 on the ability of detector circuit 500 to detect peaks of different duration, times t3 and t6 have been indicated on FIG. 8. It is noted that the placement of times t3 and t6 are for the purposes of illustration, and that in other embodiments, the peaks on the voltage level of power supply node 103 may occurs at different times relative to time t3 and t6.

At time t3, φ1 returns to a low-logic level and switches 506-509 open. This leaves the plate of capacitor 502 that is coupled to node 513 charged to voltage $V_1$, which is the voltage of node 103 at time t3. It is noted that, in various embodiments, the voltage V1 may be scaled by the resistor ratio depicted in Equation 3. At time t5 (not shown in FIG. 8), φ2 transitions to a high-logic level, which closes switches 508 and 510. When switch 508 is opened, filtered signal 518 is sampled again by capacitor 502. If the voltage level of node 513 changes between the two times when switch 508 opens (at times t3 and t6), the voltage level of node 514 changes to accommodate any change in the voltage level of node 513 to maintain the charge stored in capacitor 502 according to the charge conservation principle. The change in the voltage level of node 514 corresponds to the difference between the voltage level of filtered signal 518 at time t3 and the voltage level of filtered signal 518 at time t6. When switch 510 is opened at the end of φ2, reference voltage 512 is sampled by capacitor 503, leaving a charge on capacitor 503 that corresponds to a difference between reference voltage 511 and reference voltage 512. During φ1, the offset voltage of pre-amplifier circuit 504 is also sampled onto capacitor 502 (in particular, onto the plate of capacitor 502 coupled to node 514). In various embodiments, an autozero operation may be performed during φ1 on pre-amplifier circuit 504 to correct for offset voltage of pre-amplifier circuit 504.

While φ2 is at a high-logic level, pre-amplifier circuit 504 compares the voltages stored on capacitors 502 and 503 to generate respective voltage levels on nodes 516 and 517. As described above, latch circuit 505 uses the voltage levels of nodes 516 and 517, and $\overline{φ2}$ to generate indication signal 104. For example, when $\overline{φ2}$ transitions to a high-logic level, latch circuit 505 compares the voltage levels of nodes 516 and 517, and latches a result of the comparison to generate indication signal 104.

At time t6, φ2 returns to the low-logic level and $\overline{φ2}$ returns to a high-logic level, which causes latch circuit 505 to regenerate. The state of indication signal 104 is then updated when φ1 transitions to a high-logic level following the transition of $\overline{φ2}$ to a high logic level. By adjusting an interval between time t3 and t6, different pulse widths within a power supply glitch can be detected. For example, if a power supply glitch is not aligned within the interval between t3 and t6, then a first peak of the power supply glitch may not be detected. The power supply glitch may include additional peaks due to the ringing nature of supply noise, and subsequent peaks may still be detected even if the first peak is not detected. In various embodiments, detector circuit 500 may be configured to adjust the timing of clock signals φ1 and φ2 in order to detect different pulse widths and heights within a power supply glitch. In other embodiments, the timing of clock signals φ1 and φ2 may be programmable, allowing a user to adjust how power supply glitch data is gathered.

Figure 9:
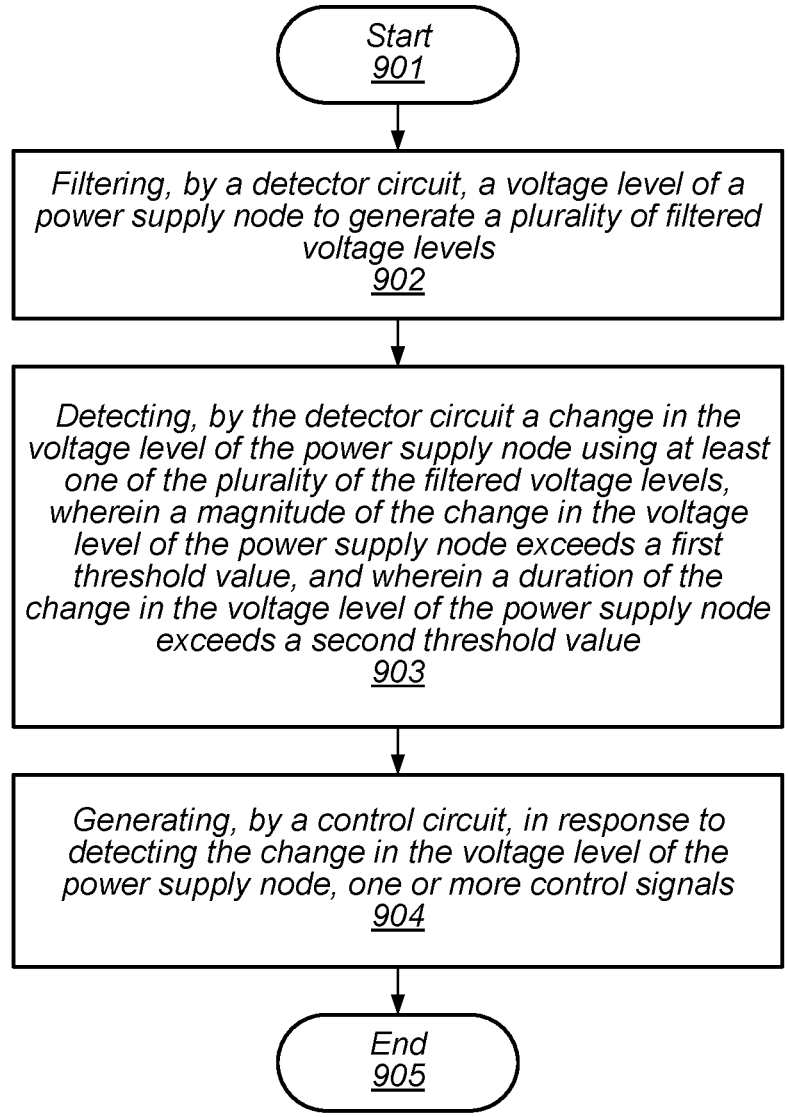
FIG. 9 depicts a flow diagram illustrating an embodiment of a method for detecting glitches on a regulated power supply node.

Turning to FIG. 9, a flow diagram depicting an embodiment of a method for operating a power supply monitor circuit is illustrated. The method, which may be applied to various detector circuits such as power supply monitor circuit 100, begins in block 901.

The method includes filtering, by a detector circuit, a voltage level of a power supply node to generate a plurality of filtered voltage levels (block 902). In various embodiments, filtering the voltage level of the power supply node includes filtering, by a low-pass filter circuit, the voltage level of the power supply node to generate a low-pass filtered signal, and filtering, by a high-pass filter circuit, the voltage level of the power supply node to generate a high-pass filtered signal. In some embodiments, filtering, by the low-pass filter circuit, includes attenuating frequency components in the voltage level of the power supply node corresponding to a change in the voltage of the power supply node.

The method further includes detecting, by the detector circuit, a change in the voltage level of the power supply node using the filtered voltage level (block 903). In various embodiments, a magnitude of the change in the voltage level of the power supply node exceeds a first threshold value, and a duration of the change in the voltage level of the power supply node exceeds a second threshold value.

In some embodiments, filtering, by the low-pass filter circuit, includes attenuating frequency components in the voltage level of the power supply node corresponding to the change in the voltage level of the power supply node. In other embodiments, detecting the change in the voltage level of the power supply node includes comparing the low-pass filter signal and the high-pass filtered signal.

The method also includes generating, by a control circuit, in response to detecting the power supply glitch, one or more control signals (block 904). In some embodiments, the method may include storing, by the control circuit, data indicative of the change in the voltage level of the power supply node. In various embodiments, the data indicative of the change in the voltage level of the power supply node includes timestamp information.

In some embodiments, the method may include adjusting one or more operating parameters of a functional circuit block coupled to the power supply node using the one or more control signals. In various embodiments, the one or more operating parameters may include a frequency of a clock signal used by the functional circuit clock, a voltage level of the power supply node, and the like. The method concludes in block 905.

Figure 10:
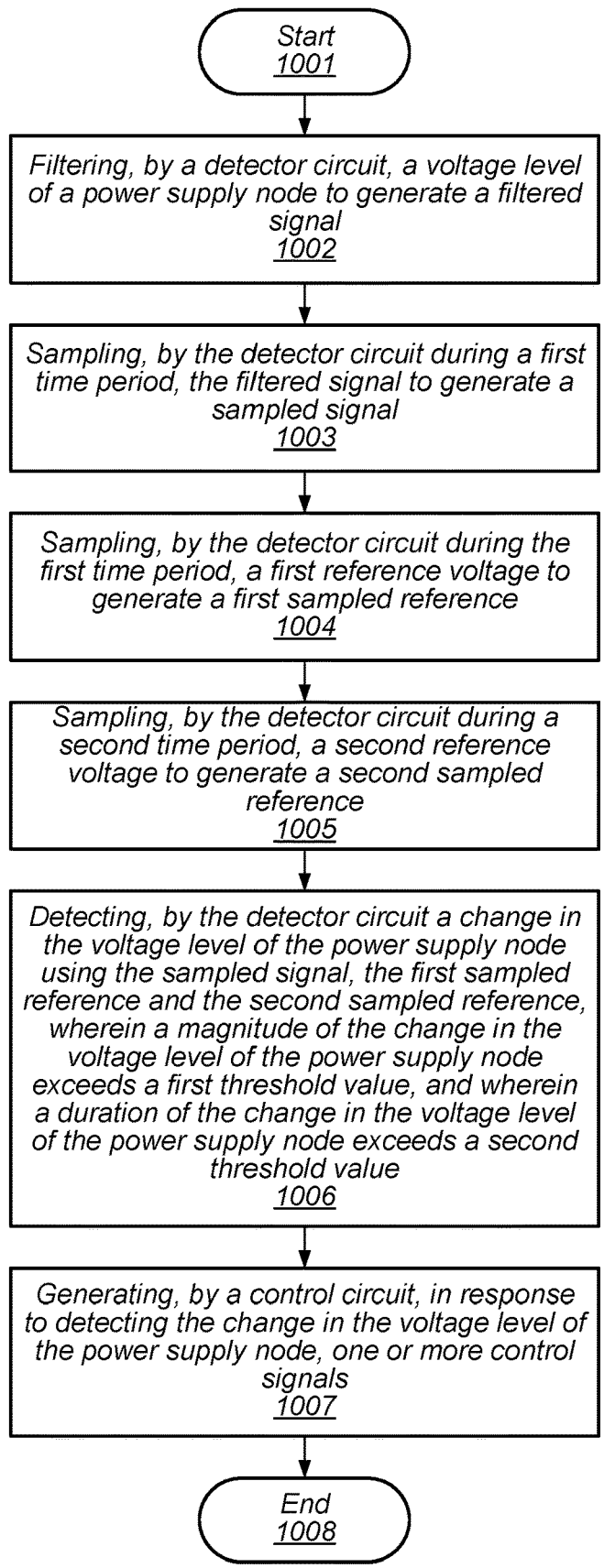
FIG. 10 depicts a flow diagram illustrating another embodiment of a method for detecting glitches on a regulated power supply node.

Turning to FIG. 10, a flow diagram depicting an embodiment of another method for operating a power supply monitor circuit is illustrated. The method, which may be applied to various power monitor circuits, such as power supply monitor circuit 100, begins in block 1001.

The method includes filtering, by a detector circuit, a voltage level of a power supply node to generate a filtered signal (block 1002). In some embodiments, filtering the voltage level of the power supply node includes high-pass filtering the voltage level of the power supply node to generate a high-pass filtered signal, and buffering the high-pass filtered signal to generate the filtered signal.

The method further includes sampling, during a first time period, the filtered signal to generate a sampled signal (block 1003). In various embodiments, sampling the filtered signal includes coupling the filtered signal to a first capacitor during the first time period. In some embodiments, the first capacitor is further coupled to a first input of a pre-amplifier circuit.

The method also includes sampling, during the first time period, a first reference voltage to generate a first sampled reference (block 1004). In some embodiments, sampling the first reference voltage includes coupling the first reference voltage to a second capacitor during the first time period. The second capacitor may, in other embodiments, be coupled to a second input of the pre-amplifier circuit.

The method further includes sampling, during a second time period, a second reference voltage to generate a second sampled reference (block 1005). In various embodiments, sampling the second reference voltage includes coupling the second reference voltage to the second capacitor during the second time period. In some embodiments, the first time period and the second time period are non-overlapping. A value of the second reference voltage may, in various embodiments, may be equal to a sum of a value of the first reference voltage and a delta reference voltage.

The method also includes detecting, by the detector circuit, a change in the voltage level of the power supply node using the sampled signal, the first sampled reference and the second sampled reference (block 1006). In various embodiments, detecting the change in the voltage level of the power supply node includes comparing, by the pre-amplifier circuit, the sampled signal and a combination of the first and second sampled references. In some cases, the method may also include coupling, during the first time period, a first output of the pre-amplifier circuit to the first input of the pre-amplifier circuit and coupling, during the first time period, a second output of the pre-amplifier circuit, to the second input of the pre-amplifier circuit. By coupling the outputs of the pre-amplifier circuit to its corresponding inputs, offset of the pre-amplifier circuit may be removed, thereby allowing a more accurate comparison of the various sampled signals.

The method may, in various embodiments, also include generating an indication signal using respective voltage levels of the first and second outputs of the pre-amplifier circuit. In some cases, generating the indication signal includes latching, during the second time period, a result of a comparison of the respective voltage levels.

The method further includes generating, by a control circuit in response to detecting change in the voltage level of the power supply node, one or more control signals (block 1007). In some embodiments, the method may also include adjusting one or more operating parameters of a functional circuit block coupled to the power supply node using the one or more control signals. In various embodiments, the one or more operating parameters may include a frequency of a clock signal used by the functional circuit clock, a voltage level of the power supply node, and the like. The method concludes in block 1008.

Figure 11:
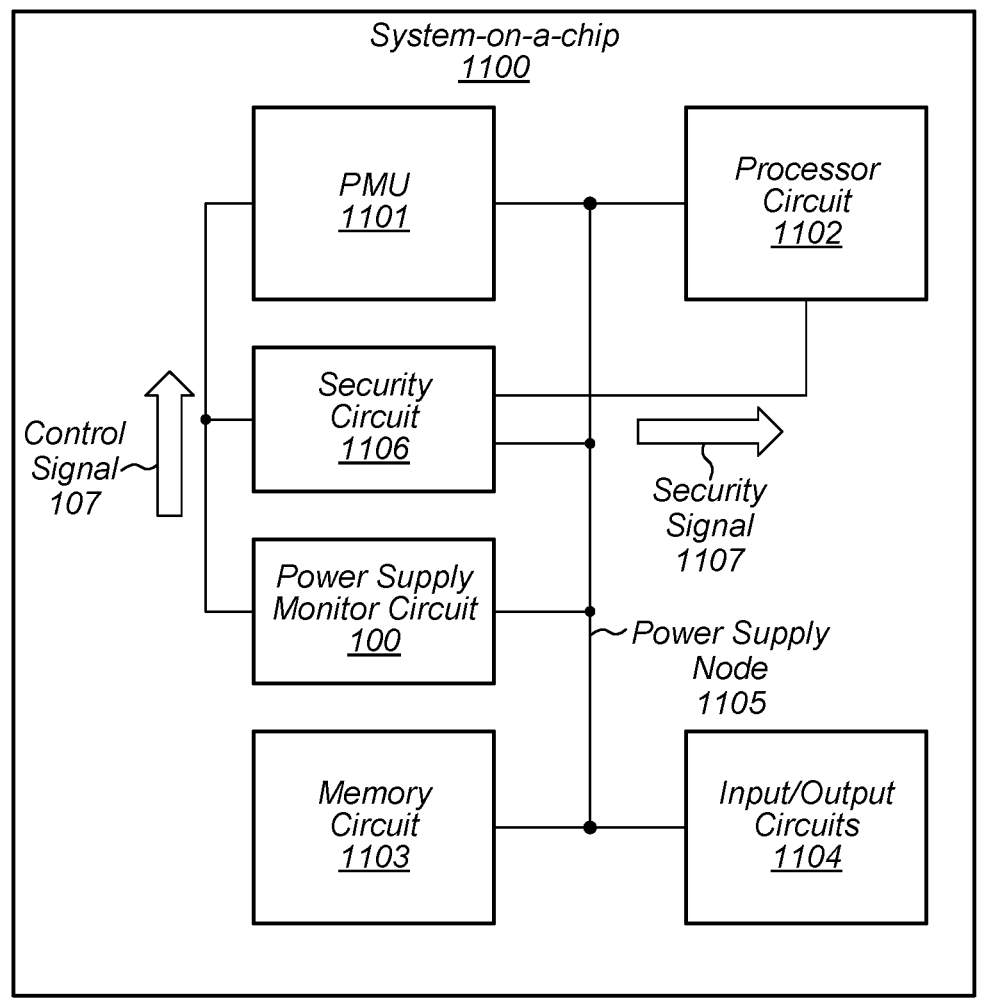
FIG. 11 is a block diagram of a system-on-a-chip.

A block diagram of a system-on-a-chip (SoC) is illustrated in FIG. 11. In the illustrated embodiment, the SoC 1100 includes a power management unit (denoted as "PMU 1101"), processor circuit 1102, memory circuit 1103, input/output circuits 1104, security circuit 1106, and power supply monitor circuit 100, each of which is coupled to power supply node 1105. In some cases, power supply node 1105 may be a digital power supply node for use with digital logic circuit, while in other embodiments, power supply node 1105 may be an analog power supply node suitable for use with analog and/or mixed-signal circuits.

PMU 1101 is configured to generate a regulated voltage level on power supply node 1105. In various embodiments, PMU 1101 may include one or more power converter or voltage regulator circuits. In some cases, PMU 1101 may employ passive devices, such as inductors, that may be located on SoC 1100 or on a different integrated circuit separate from SoC 1100. In some embodiments, PMU 1101 may adjust the performance of the power converter or voltage regulator circuits based on control signal 107.

Processor circuit 1102 may, in various embodiments, be representative of a general-purpose processor that performs computational operations. For example, processor circuit 1102 may be a central processing unit (CPU) such as a microprocessor, a microcontroller, an application-specific integrated circuit (ASIC), or a field-programmable gate array (FPGA). In some embodiments, processor circuit 1102 may enter a secure mode of operation in response to an activation of security signal 1107. The secure mode may, in various embodiments, temporarily halt operation of processor circuit 1102 to prevent the execution of a malicious program of software application introduced during a glitch on power supply node 1105.

Memory circuit 1103 may, in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 11, in other embodiments, any suitable number of memory circuits may be employed.

Input/output circuits 1104 may be configured to coordinate data transfer between SoC 1100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1104 may be configured to implement a version of Universal Serial Bus (USB) protocol or IEEE 1394 (Firewire®) protocol.

Input/output circuits 1104 may also be configured to coordinate data transfer between SoC 1100 and one or more devices (e.g., other computing systems or integrated circuits) coupled to SoC 1100 via a network. In one embodiment, input/output circuits 1104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1104 may be configured to implement multiple discrete network interface ports.

Security circuit 1106 is configured to generate security signal 1107 using control signal 107. In various embodiments, security circuit 1106 may be configured to activate security signal 1107 in response to multiple activations of control signal 107, which may be indicative of an attempt to tamper with the operation of SoC 1100 and force the execution of a malicious software program or application. Security circuit 1106 may be implemented using any suitable combination of combinatorial logic and sequential logic circuits. It is noted that although security circuit 1106 is depicted as being coupled to power supply node 1105, in other embodiments, security circuit 1106 may be coupled to a dedicated power supply node so that any attempt to introduce glitches on power supply node 1105 will not affect the operation of security circuit 1106. It is further noted that although security signal 1107 is depicted as being coupled to only processors 1102, in other embodiments, security signal 1107 may be coupled to any or all of the remaining circuit blocks included in SoC 1100.

Figure 12:
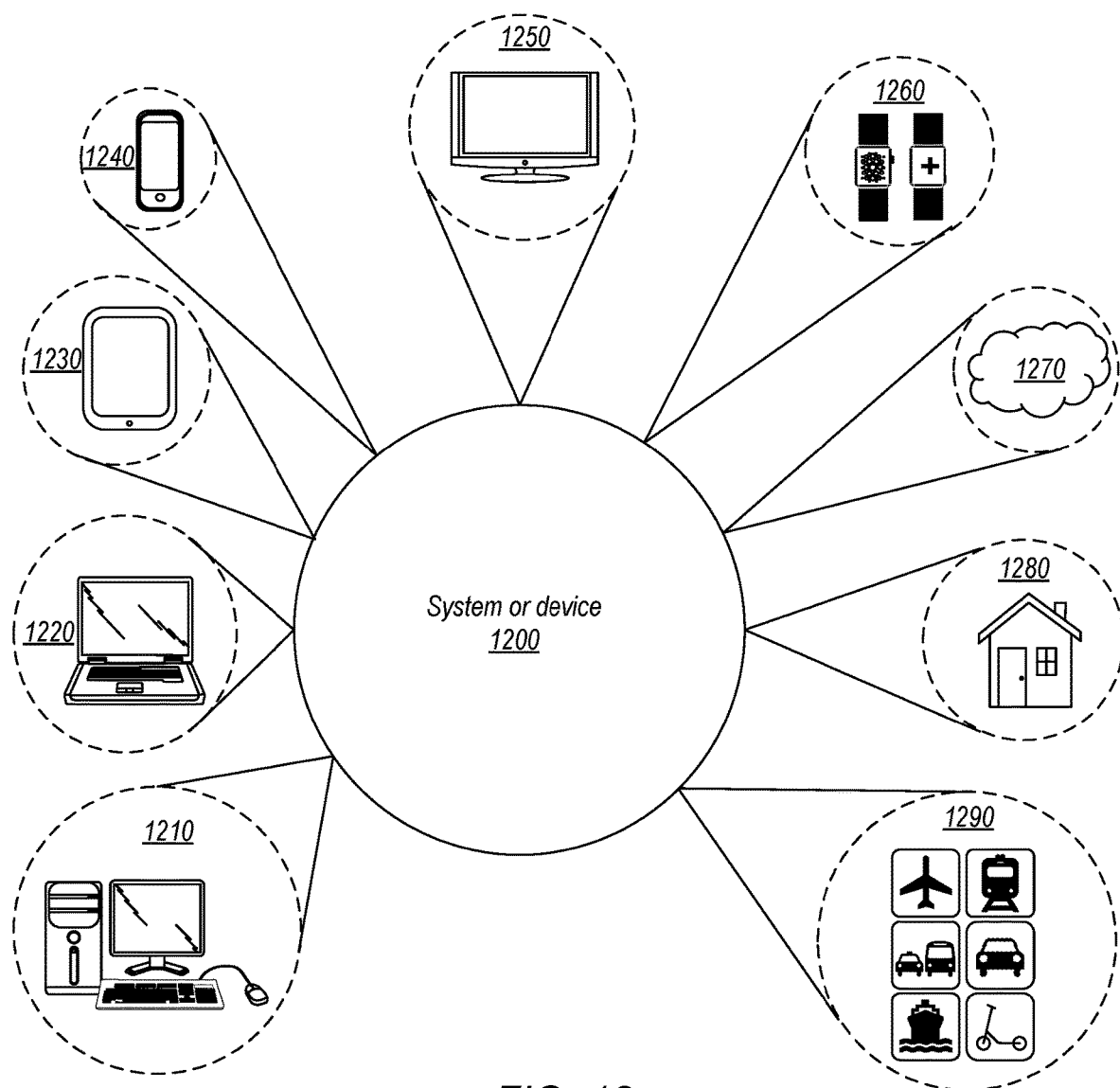
FIG. 12 is a block diagram of various embodiments of computer systems that may include power supply circuits.

Turning now to FIG. 12, various types of systems that may include any of the circuits, devices, or systems discussed above are illustrated. System or device 1200, which may incorporate or otherwise utilize one or more of the techniques described herein, may be utilized in a wide range of areas. For example, system or device 1200 may be utilized as part of the hardware of systems such as a desktop computer 1210, laptop computer 1220, tablet computer 1230, cellular or mobile phone 1240, or television 1250 (or set-top box coupled to a television).

Similarly, disclosed elements may be utilized in a wearable device 1260, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1200 may also be used in various other contexts. For example, system or device 1200 may be utilized in the context of a server computer system, such as a dedicated server or on shared hardware that implements a cloud-based service 1270. Still further, system or device 1200 may be implemented in a wide range of specialized everyday devices, including devices 1280 commonly found in the home such as refrigerators, thermostats, security cameras, etc. The interconnection of such devices is often referred to as the "Internet of Things" (IoT). Elements may also be implemented in various modes of transportation. For example, system or device 1200 could be employed in the control systems, guidance systems, entertainment systems, etc. of various types of vehicles 1290.

The applications illustrated in FIG. 12 are merely exemplary and are not intended to limit the potential future applications of disclosed systems or devices. Other example applications include, without limitation: portable gaming devices, music players, data storage devices, unmanned aerial vehicles, etc.

Figure 13:
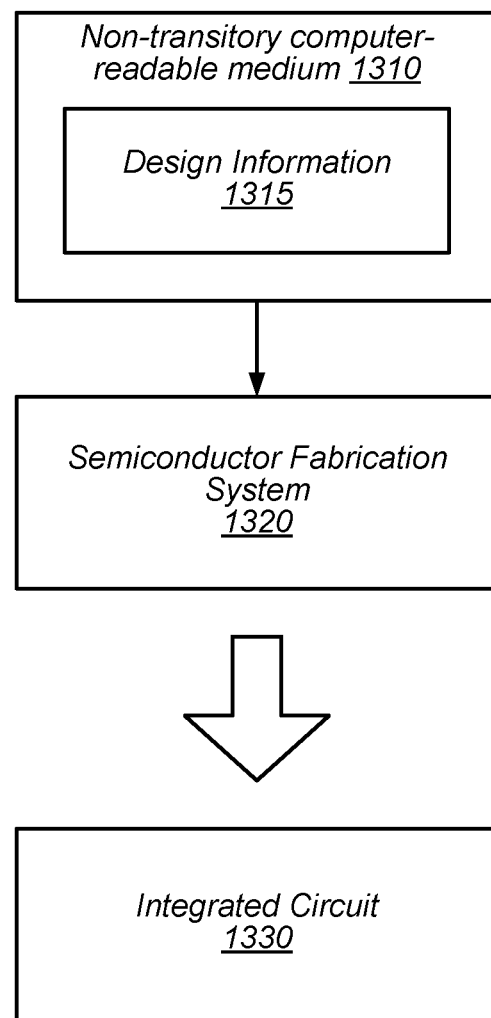
FIG. 13 illustrates an example of a non-transitory computer-readable storage medium that stores circuit design information.

FIG. 13 is a block diagram illustrating an example of a non-transitory computer-readable storage medium that stores circuit design information, according to some embodiments. In the illustrated embodiment, semiconductor fabrication system 1320 is configured to process the design information 1315 stored on non-transitory computer-readable storage medium 1310 and fabricate integrated circuit 1330 based on the design information 1315.

Non-transitory computer-readable storage medium 1310 may comprise any of various appropriate types of memory devices or storage devices. Non-transitory computer-readable storage medium 1310 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash memory, magnetic media, e.g., a hard drive, or optical storage; registers, or other similar types of memory elements, etc. Non-transitory computer-readable storage medium 1310 may include other types of non-transitory memory as well or combinations thereof. Non-transitory computer-readable storage medium 1310 may include two or more memory mediums, which may reside in different locations, e.g., in different computer systems that are connected over a network.

Design information 1315 may be specified using any of various appropriate computer languages, including hardware description languages such as, without limitation: VHDL, Verilog, SystemC, SystemVerilog, RHDL, M, MyHDL, etc. Design information 1315 may be usable by semiconductor fabrication system 1320 to fabricate at least a portion of integrated circuit 1330. The format of design information 1315 may be recognized by at least one semiconductor fabrication system, such as semiconductor fabrication system 1320, for example. In some embodiments, design information 1315 may include a netlist that specifies elements of a cell library, as well as their connectivity. One or more cell libraries used during logic synthesis of circuits included in integrated circuit 1330 may also be included in design information 1315. Such cell libraries may include information indicative of device or transistor level netlists, mask design data, characterization data, and the like, of cells included in the cell library.

Integrated circuit 1330 may, in various embodiments, include one or more custom macrocells, such as memories, analog or mixed-signal circuits, and the like. In such cases, design information 1315 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1320 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1320 may also be configured to perform various testing of fabricated circuits for correct operation.

In various embodiments, integrated circuit 1330 is configured to operate according to a circuit design specified by design information 1315, which may include performing any of the functionality described herein. For example, integrated circuit 1330 may include any of various elements shown or described herein. Further, integrated circuit 1330 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set

[w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
    a detector circuit configured to:
        filter a voltage level of a power supply node to generate a plurality of filtered signals, wherein to generate the plurality of filtered signals, the detector circuit is further configured to:
            low-pass filter the voltage level of the power supply node to generate a low-pass filtered signal; and
            high-pass filter the voltage level of the power supply node to generate a high-pass filtered signal; and
        generate, using at least one of the plurality of filtered signals, an indication signal in response to a detection of a change in the voltage level of the power supply node, wherein a magnitude of the change in the voltage level of the power supply node exceeds a first threshold value, and wherein a duration of the change in the voltage level of the power supply node exceeds a second threshold value; and
    a control circuit configured to generate one or more control signals using the indication signal.

2. The apparatus of claim 1, wherein to generate the indication signal, the detector circuit is further configured to compare the low-pass filter signal and the high-pass filtered signal.

3. The apparatus of claim 1, wherein the control circuit is further configured to store data indicative of the change in the voltage level of the power supply node.

4. The apparatus of claim 3, wherein the data indicative of the change in the voltage level includes timestamp information.

5. The apparatus of claim 1, further comprising a functional circuit block coupled to the power supply node, wherein the functional circuit block is configured to adjust an operating mode using the at least one of the one or more control signals.

6. The apparatus of claim 1, wherein the detector circuit is configured to perform correlated double sampling to detect the change in the voltage level of the power supply node.

7. A method, comprising:
    filtering, by a detector circuit, a voltage level of a power supply node to generate a plurality of filtered voltage levels, wherein the filtering includes:
        filtering, by a low-pass filter circuit, the voltage level of the power supply node to generate a low-pass filtered signal; and
        filtering, by a high-pass filter circuit, the voltage level of the power supply node to generate a high-pass filtered signal;
    detecting, by the detector circuit, a change in the voltage level of the power supply node using at least one of the plurality of filtered voltage levels, wherein a magnitude of the change in the voltage level of the power supply node exceeds a first threshold value, and wherein a duration of the change in the voltage level of the power supply node exceeds a second threshold value; and
    generating, by a control circuit, in response to detecting the change in the voltage level of the power supply node, one or more control signals.

8. The method of claim 7, wherein filtering, by the low-pass filter circuit, the voltage level of the power supply node includes attenuating frequency components in the voltage level of the power supply node corresponding to the change in the voltage level of the power supply node.

9. The method of claim 7, wherein detecting the change in the voltage level of the power supply node includes comparing the low-pass filter signal and the high-pass filtered signal.

10. The method of claim 7, further comprising storing, by the control circuit, data indicative of the change in the voltage level of the power supply node.

11. The method of claim 10, wherein the data indicative of the change in the voltage level includes timestamp information.

12. The method of claim 7, further comprising, adjusting one or more operating parameters of a functional circuit block coupled to the power supply node using the one or more control signals.

13. The method of claim 7, wherein detecting the change in the voltage level of the power supply node comprises performing, by the detector circuit, a correlated double sampling of the at least one of the filtered voltage levels.

14. An apparatus, comprising:
a functional circuit coupled to a power supply node; and
a detector circuit configured to:
filter a voltage level of the power supply node to generate a filtered signal;
sample, during a first period of time, the filtered signal to generate a sampled signal;
sample, during the first period of time, a first reference voltage to generate a first sampled reference;
sample, during a second period of time, a second reference voltage to generate a second sampled reference; and
detect a change in the voltage level of the power supply node using the sampled signal, the first sampled reference, and the second sampled reference, wherein, to detect the change, the detector circuit is configured to compare a voltage level of the filtered signal to the first reference voltage and, subsequently, to the second reference voltage, wherein a magnitude of the change in the voltage level of the power supply node exceeds a first threshold value, and a duration of the change in the voltage level of the power supply node exceeds a second threshold value.

15. The apparatus of claim 14, further comprising a control circuit configured to generate one or more control signals in response to a detection of the change in the voltage level of the power supply node.

16. The apparatus of claim 15, wherein the functional circuit is configured to adjust one or more operating parameters using the one or more control signals.

17. The apparatus of claim 14, wherein to sample, during the first period of time, the filtered signal, the detector circuit is further configured to couple the filtered signal to a first capacitor during the first period of time.

18. The apparatus of claim 17, wherein to sample, during the first period of time, the first reference voltage, the detector circuit is further configured to couple the first reference voltage to a second capacitor.

19. The apparatus of claim 14, wherein to detect the change in the voltage level of the power supply node, the detector circuit is further configured to perform a comparison of the sampled signal and a combination of the first sampled reference and the second sampled reference.

20. The apparatus of claim 19, wherein the detector circuit is further configured to latch a result of the comparison to generate a glitch signal.

* * * * *